United States Patent
Pon et al.

(10) Patent No.: US 11,948,917 B2
(45) Date of Patent: Apr. 2, 2024

(54) DIE OVER MOLD STACKED SEMICONDUCTOR PACKAGE

(71) Applicant: Intel Corporation, Santa Clara, CA (US)

(72) Inventors: Florence Pon, Folsom, CA (US); Yi Xu, Folsom, CA (US); James Zhang, Folsom, CA (US); Yuhong Cai, Folsom, CA (US); Tyler Leuten, Orangevale, CA (US); William Glennan, Folsom, CA (US); Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 893 days.

(21) Appl. No.: 16/392,295

(22) Filed: Apr. 23, 2019

(65) Prior Publication Data

US 2020/0343221 A1 Oct. 29, 2020

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/565* (2013.01); *H01L 23/3128* (2013.01);
(Continued)

(58) Field of Classification Search
CPC ............... H01L 25/0657; H01L 21/565; H01L 23/3135; H01L 24/48; H01L 25/50
(Continued)

(56) References Cited

U.S. PATENT DOCUMENTS

2013/0049221 A1* 2/2013 Han ............... H01L 21/561 257/E23.116
2013/0062758 A1* 3/2013 Imoto ............ H01L 23/49894 257/737

(Continued)

FOREIGN PATENT DOCUMENTS

WO WO 2017160231 9/2017

OTHER PUBLICATIONS

Search Report for European Patent Application No. 20164012.5, dated Sep. 16, 2020, 8 pgs.

*Primary Examiner* — Quoc D Hoang
(74) *Attorney, Agent, or Firm* — Schwabe, Williamson & Wyatt, P.C.

(57) ABSTRACT

Embodiments described herein provide a semiconductor package comprising multiple dies encapsulated in multiple molding compounds. In one example, a semiconductor package comprises: a first die or die stack on a substrate; a first molding compound encapsulating the first die or die stack on the substrate; a second die or die stack on the first molding compound; and a second molding compound encapsulating the second die or die stack and at least one portion of the first molding compound. In this example, the first die or die stack is electrically coupled to the substrate using a first wire bond and the second die or die stack is electrically coupled to the substrate using a second wire bond. Additionally, the first molding compound encapsulates the first wire bond and the second molding compound encapsulates the second wire bond. Furthermore, a footprint of the second die overlaps a footprint of the first die.

21 Claims, 11 Drawing Sheets

(51) Int. Cl.
   *H01L 23/00*   (2006.01)
   *H01L 23/31*   (2006.01)
   *H01L 25/00*   (2006.01)

(52) U.S. Cl.
   CPC .......... *H01L 23/3135* (2013.01); *H01L 24/48* (2013.01); *H01L 25/50* (2013.01); *H01L 24/32* (2013.01); *H01L 24/33* (2013.01); *H01L 24/73* (2013.01); *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48145* (2013.01); *H01L 2224/48227* (2013.01); *H01L 2224/73215* (2013.01); *H01L 2224/73265* (2013.01); *H01L 2225/06506* (2013.01); *H01L 2225/0651* (2013.01); *H01L 2225/06562* (2013.01); *H01L 2225/06586* (2013.01)

(58) Field of Classification Search
   USPC ........................................................ 257/784
   See application file for complete search history.

(56) References Cited

U.S. PATENT DOCUMENTS

| | | | |
|---|---|---|---|
| 2015/0061157 A1* | 3/2015 | Yu ........................... | H01L 25/50 |
| | | | 257/777 |
| 2015/0069632 A1* | 3/2015 | Ozawa .............. | H01L 23/49838 |
| | | | 257/777 |
| 2015/0130030 A1 | 5/2015 | Ma | |
| 2019/0164888 A1* | 5/2019 | Chang Chien .... | H01L 21/76843 |
| 2019/0341369 A1* | 11/2019 | Chang Chien ...... | H01L 23/3135 |

\* cited by examiner

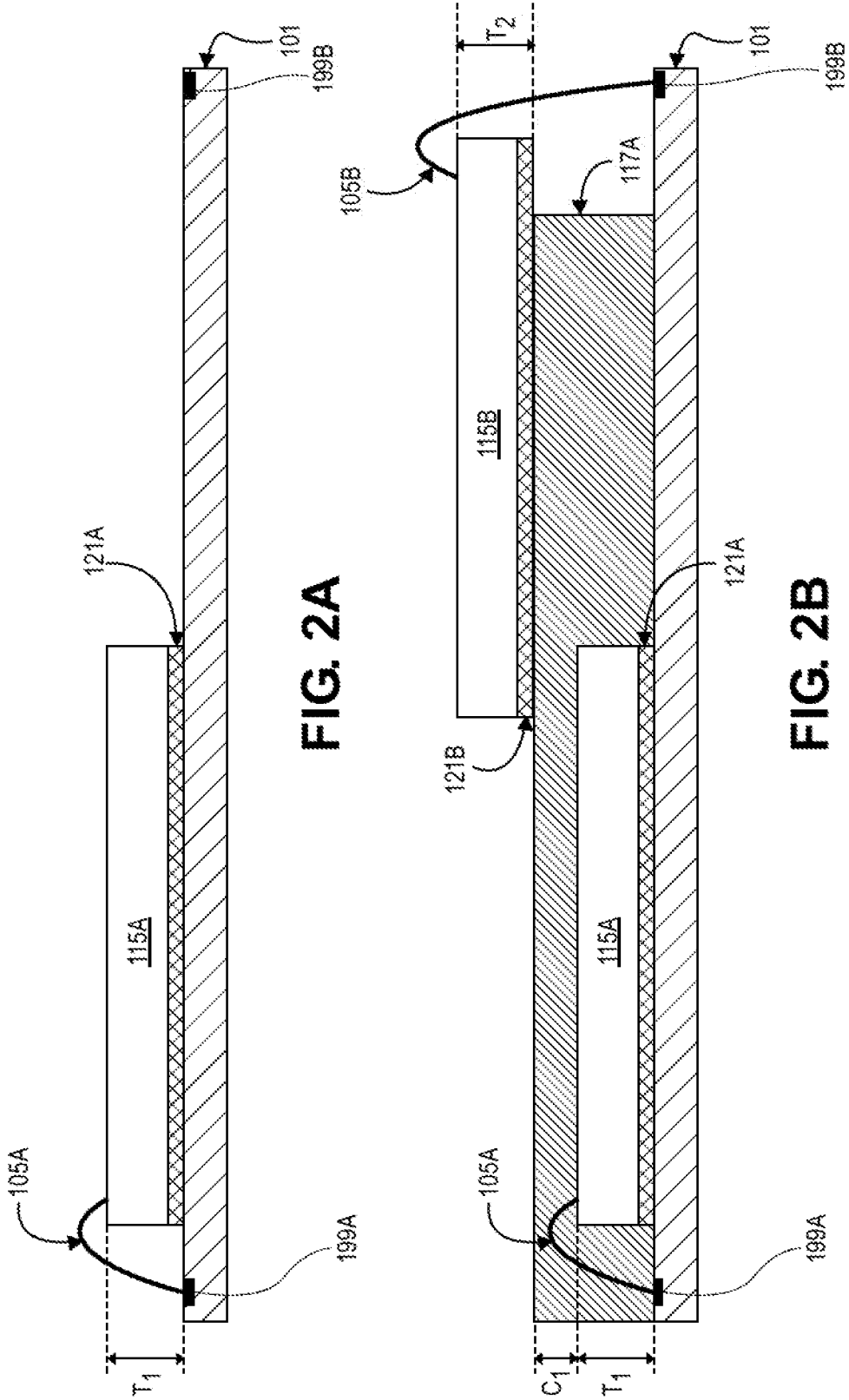

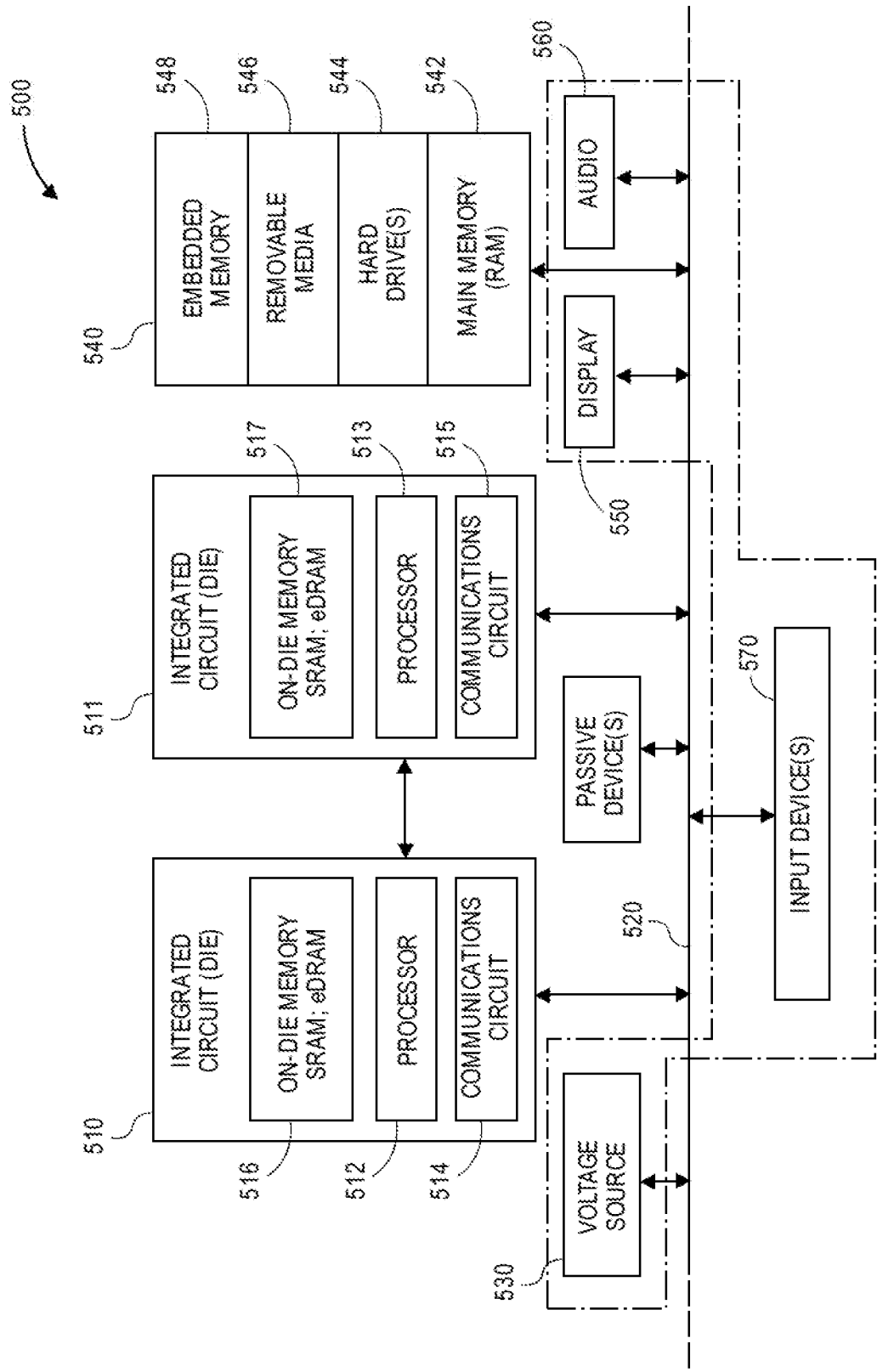

US 11,948,917 B2

DIE OVER MOLD STACKED SEMICONDUCTOR PACKAGE

BACKGROUND

Field

Embodiments described herein generally relate to semiconductor packages. More particularly, but not exclusively, embodiments described herein relate to a semiconductor package comprising stacked components and techniques of fabricating semiconductor packages.

Background Information

A semiconductor package may comprise two or more dies on a package substrate. In such a package, the dies may be stacked on top each other. Stacking dies on each other may require the upper die to overhang the lower die.

When a portion of the upper die that overhangs the lower die is sufficiently large, the overhanging portion of the upper die may be supported by a silicon spacer that is positioned next to the lower die. However, using a silicon spacer creates a channel between the lower die and the silicon spacer that can cause formation of unwanted voids during the molding process. To avoid creating these voids, complicated and expensive molding techniques are required. Furthermore, the addition of a silicon spacer can negatively affect the semiconductor package's ability to withstand warpage. This is because the silicon spacer negatively affects the silicon to molding compound volume ratio in the semiconductor package. Improving the silicon to molding compound volume ratio in a semiconductor package can be achieved by increasing the number of silicon spacers in the package. For example, two or more silicon spacers can be included in a semiconductor package to balance the amount of silicon in the package with the amount of molding compound used in the package. For this example, a first silicon spacer may be positioned next to the lower die under a portion of the upper die that overhangs the lower die and a second silicon spacer may be positioned next to the upper die on a portion of the lower die. In this way, the silicon to molding compound volume ratio in the semiconductor package may be balanced so that the semiconductor package's ability to withstand warpage is not negatively impacted. The use of multiple silicon spacers, however, increases the cost and complexity of fabricating a semiconductor package. The silicon spacers may also hinder optimizing (e.g., reducing, etc.) the z-height of the semiconductor package.

Silicon spacers do not always have to be used in semiconductor packages comprising stacked dies. In a semiconductor package that lacks silicon spacers, stacking dies requires the bottommost die in a die stack to be larger (e.g., thickness, footprint, etc.) than the other die(s) in the die stack. In this way, the other die(s) in the die stack reside on a solid base (i.e., the relatively larger bottommost die in the die stack). Because the relatively larger bottommost die is needed in the die stack, the z-height of the die stack and a semiconductor package comprising the die stack cannot be optimized (e.g., reduced, etc.). In package-on-package configurations, the z-height cannot be optimized (e.g., reduced, etc.) because of the thick bottommost dies that act as bases for other die(s), added substrates, added adhesive layers, and increased wire heights.

In view of the description provided above, at least one architecture of a semiconductor package that comprises stacked dies and at least one technique of stacking dies in a semiconductor package remain suboptimal.

BRIEF DESCRIPTION OF THE DRAWINGS

Embodiments described herein are illustrated by way of example and not a limitation in the figures of the accompanying drawings, in which like references indicate similar features. Furthermore, in the figures, some conventional details have been omitted so as not to obscure from the inventive concepts described herein.

FIGS. 2A-2C are cross sectional side view illustrations of a process of fabricating a semiconductor package comprising multiple dies encapsulated in multiple molding compounds, according to one embodiment.

FIG. 5 is a schematic illustration of a computer system, according to one embodiment.

DETAILED DESCRIPTION

Figure 1A:
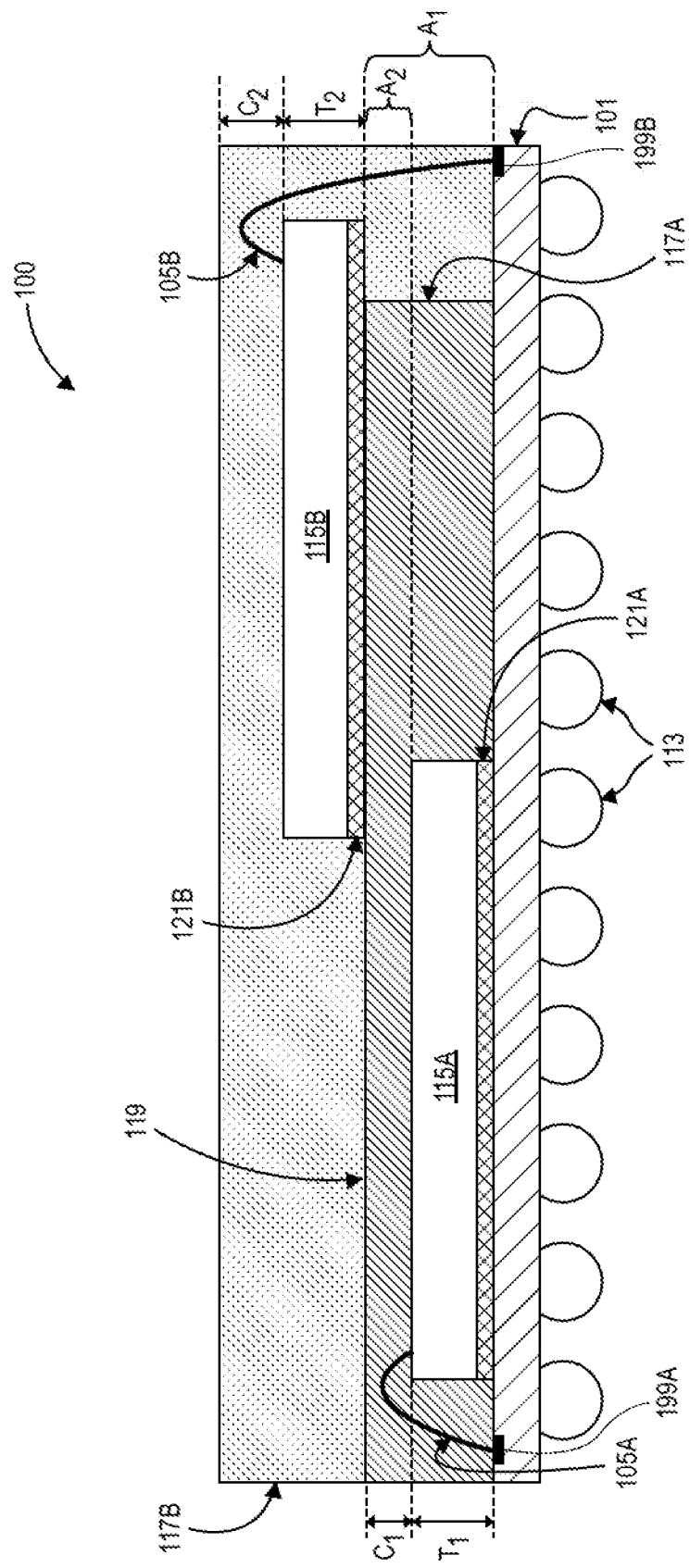
FIG. 1A is a cross sectional side view illustration of a semiconductor package comprising multiple dies encapsulated in multiple molding compounds, according to one embodiment.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as a redistribution layer (RDL), are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein provide a semiconductor package comprising multiple dies encapsulated in multiple molding compounds. In one embodiment, the semiconductor package comprises a first die or die stack on a substrate; a first molding compound encapsulating the first die or die stack on the substrate; a second die or die stack on the first molding compound; and a second molding compound encapsulating the second die or die stack and at least one portion of the first molding compound. In one embodiment, the second die or die stack overhangs the first molding compound. In one embodiment, the second die or die stack does not overhang the first molding compound. Furthermore, a thickness of the first die or die stack may be less than or equal to a thickness of the second die stack. For a specific example, one or both the die stacks may include a base die that has a thickness that is less than or equal to a thickness of at least one of the dies above the base die.

The architecture of the semiconductor package set forth in the embodiments described herein enables dies or die stacks to be stacked on top one another in a way that minimizes or eliminates the shortcomings described above. For example, the architecture of the semiconductor package set forth in the embodiments described herein eliminates the use of silicon spacers, which in turn eliminates the creation of channels between the dies or die stacks and the need to use complicated and expensive molding techniques to avoid creating voids in the semiconductor package. Furthermore, the architecture of the semiconductor package set forth in the embodiments described herein enables dies or die stacks to be stacked on top one another in a way that optimizes (e.g., reduces, etc.) the package's z-height. Other advantages are evident from the description provided below in connection with the Figures and the Figures themselves.

FIG. 1A is a cross sectional side view illustration of a semiconductor package 100 that comprises multiple dies 115A-115B encapsulated in multiple molding compounds 117A-117B, according to an embodiment. The semiconductor package 100 comprises a substrate 101, which may be formed from an organic material, an inorganic material, or a combination thereof. The substrate 101 may comprise a plurality of layers (e.g., a build-up layer formed from a dielectric material, a metal layer, a seed layer formed from a metallic material, a solder resist layer formed from a solder resist material, etc.). The substrate 101 may comprise a redistribution layer (RDL) positioned therein. The RDL may be comprise a plurality of build-up layers and metal layers. Furthermore, the substrate 101 may comprise any suitable component known in the art that may be positioned in or on a substrate (e.g., an active element (e.g., a transistor, a rectifier, a thyristor, etc.), a passive device (e.g., a resistor, a capacitor, an inductor, a diode, etc.), a power source, etc.). In one embodiment, pads 199A-199B are positioned in the substrate 101 on opposite ends of the substrate 101.

Interconnects 113 may be positioned on a bottom side of the substrate 101. Interconnects 113 may include, but are not limited to, bumps and pillars. Interconnects 113 may be formed from solder, copper, or any other suitable material or combination of suitable materials.

In one embodiment, a die 115A is positioned on a top surface of the substrate 101. In one embodiment, the die 115A is physically coupled to the substrate 101 using a die attach material (e.g., die attach film (DAF), adhesive, eutectic bond, epoxy bond, solder attach bond, etc.) 121A. Furthermore, and in one embodiment, the die 115A is electrically coupled to the pad 199A in the substrate 101 using a wire bond 105A.

In one embodiment, a molding compound 117A encapsulates top and sidewall surfaces of the die 115A, sidewall surfaces of the die attach material 121A, and the entire wire bond 105A on the top surface of the substrate 101. Any suitable encapsulation technique or combination of encapsulation techniques known in the art may be used to perform the encapsulation. The encapsulation technique(s) may be controlled to achieve a desired clearance distance $C_1$ between a top surface of the molding compound 117A and a top surface of the die 115A. For example, and in one embodiment, a thickness of the molding compound 117A may be reduced by polishing or grinding the top surface of the molding compound 117A until the desired clearance distance $C_1$ is achieved. In one embodiment, the clearance distance $C_1$ ranges from 20 microns ($\mu$m) to 80 $\mu$m. The clearance distance $C_1$ may accommodate the height of the wire bond 105A. In one embodiment, the molding compound 117A encapsulates a portion of the top surface of the substrate 101. That is, and in this embodiment, the molding compound 117A covers less than the entirety of the top surface of the substrate 101. Consequently, the molding compound 117A contacts a portion of the top surface of the substrate 101.

A die 115B is positioned on a top surface of the molding compound 117A, according to one embodiment. As shown, and in one embodiment, the die 115B is physically coupled to the molding compound 117A using a die attach material 121B. Furthermore, and in one embodiment, the die 115B is electrically coupled to a pad 199B positioned in the substrate 101 using a wire bond 105B. In one embodiment, the die 115B is positioned on the top side of the molding compound 117A such that an area (e.g., in the x-y plane) of the die 115B at least partially overlaps an area (e.g., in the x-y plane) of the die 115A. Stated differently, a footprint of the die 115B at least partially overlaps a footprint of the die 115A.

In one embodiment, a molding compound 117B encapsulates top and sidewall surfaces of the die 115B, sidewall surfaces of the die attach material 121B, the entire wire bond 105B, and top and sidewall surfaces of the molding compound 117A on the top surface of the substrate 101. Any suitable encapsulation technique or combination of encapsulation techniques known in the art may be used to perform the encapsulation. The encapsulation technique(s) may be controlled to achieve a desired clearance distance $C_2$ between a top surface of the molding compound 117B and a top surface of the die 115B. The clearance distance $C_2$ accommodates a height of wire bond 105B. For example, a top surface of the molding compound 117B may be polished or ground until the desired clearance distance $C_2$ is achieved. In one embodiment, the clearance distance $C_2$ is at least 20 $\mu$m. In one embodiment, the molding compound 117B contacts a portion of the top surface of the substrate 101.

The molding compounds 117A-117B may be formed from plastics or polymers. For example, the molding compounds 117A-117B may include organic resins with (or without) filler particles. In one embodiment, the molding compounds 117A-117B differ from each other. For example, a filler composition of the molding compound 117A may be different than a filler composition of the molding compound 117B. In other embodiments, the molding compound 117A may be the same material composition as the molding compound 117B. In such embodiments, there may be no discernable boundary between the molding compound 117A and the molding compound 117B. In other embodiments, and as shown in FIG. 1A, a weld line 119 may be discernable between the molding compound 117A and the molding compound 117B even when they comprise the same material composition.

As shown in FIG. 1A, and in one embodiment, the die 115B overhangs the molding compound 117A. The wire bond 105B is fabricated on the overhanging part of the die 115B to electrically couple the die 115B to the substrate 101. The overhanging of the die 115B on the molding compound 117A has several advantages. One advantage is that the overhanging of the die 115B assists with preventing a manufacturing defect called a "mold flash." A mold flash is an undesired bleed out of molding material. A mold flash is created when the edge of the molding compound 117A that is next to the pad 199B is too close to bond fingers associated with the pad 199B. A mold flash that is too close to the bond fingers associated with the pad 119B will prevent successful wire bonding. Thus, the overhanging of the die 115B can assist with preventing a mold flash, which in turn assists with facilitating successful wire bonding of the wire 105B. Furthermore, the overhanging of the die 115B assists with (i) keeping the length of the wire 105B as short as possible; and (ii) making the length of the wire 105B equal (e.g., approximately equal) to the length of the wire 105A.

In one embodiment, and as shown in FIG. 1A, the substrate 101 comprises two sidewall surfaces. In this embodiment, the wire bond 105A is adjacent to a sidewall surface of the molding compound 117A that is next to a sidewall surface of the substrate 101 and the wire bond 105B is adjacent to a sidewall surface of the molding compound 117B that is next to the other sidewall surface of the substrate 101. Stated differently, the wire bonds 105A-105B are on opposite sides of the semiconductor package 100. In at least one currently available architecture of a semiconductor package, the overhanging part of the die must be sufficiently large in size (e.g., in length, in thickness, etc.) to accommodate the wire bond fabricated thereon. However, and in this currently available architecture, the wire bonding process to attach the wire bond on the overhanging part of the die creates a load on the die that may cause the die to break, crack, warp, or flex. In contrast, the embodiment of the semiconductor package 100 shown in FIG. 1A does not suffer from these issues. This is because the die 115B sits on the molding compound 117A. As a result, the overhanging part of the die 115B is firmly supported by the molding compound 117A. Consequently, any pressure applied to the die 115B during the wire bonding process to attach wire bond 105B on the overhanging part of the die 115B is accommodated by the underlying molding compound 117A. The molding compound 117A, therefore, minimizes or eliminates damage to the die 115B that may be attributable to a load created by the wire bonding process to attach the wire bond 105B. The thickness $T_1$ of the die 115A may be equal to, less than, or greater than a thickness $T_2$ of the die 115B. In one embodiment, the thickness $T_1$ is equal to or less than the thickness $T_2$. Given that the thicknesses of the dies 115A-115B do not exceed each other, the z-height of the semiconductor package 100 may be optimized (e.g., reduced, etc.).

In one embodiment, the semiconductor package 100 comprises an area $A_1$ under the die 115B that is formed from the molding compounds 117A-117B. For example, an area $A_2$, which is part of the area $A_1$ and between the dies 115A-115B, is formed from the molding compound 117A, the molding compound 117B, or both. The area $A_1$ includes no voids therein. In particular, the molding compounds 117A-117B eliminate the use of silicon spacers, which in turn eliminates the creation of channels between the dies 115A-115B and the need to use complicated and expensive molding techniques that are necessary to prevent the creation of voids in the semiconductor package 100.

Figure 1B:
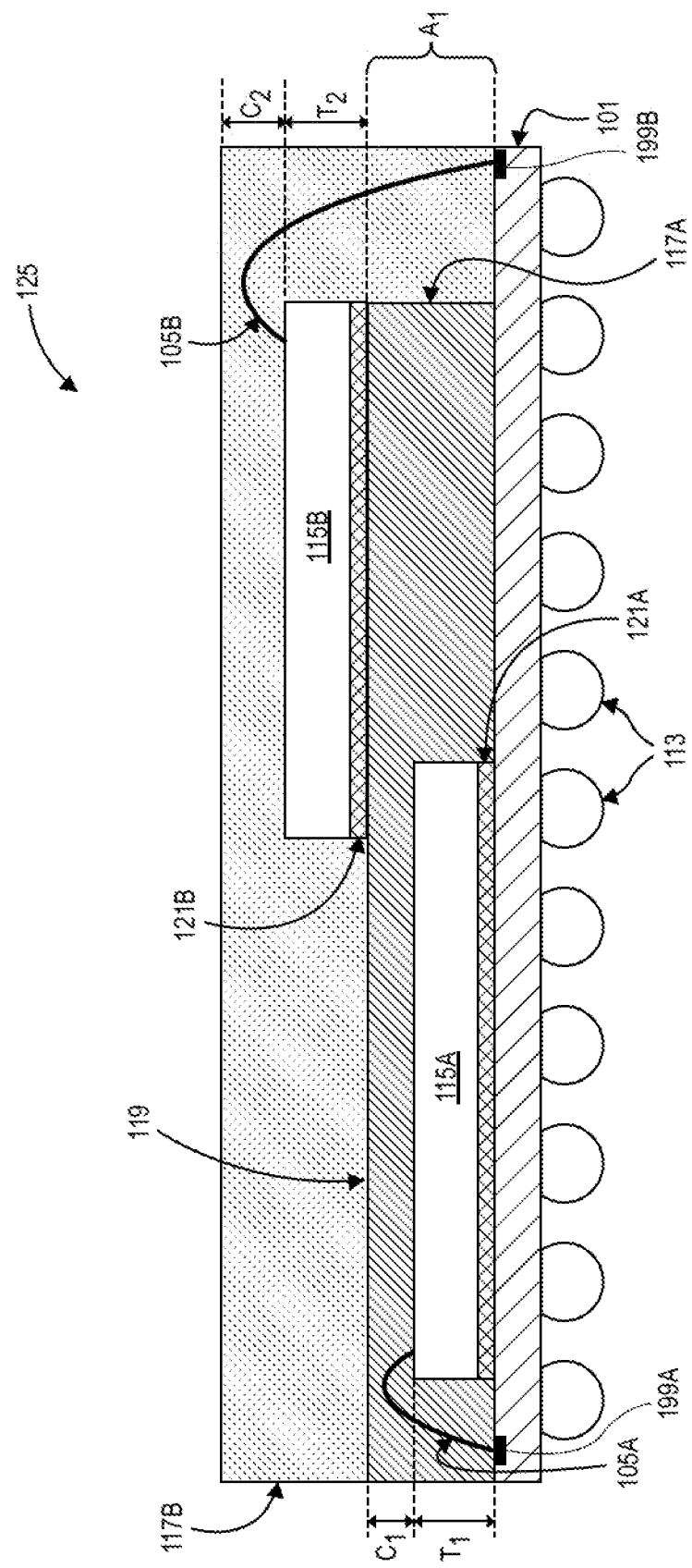
FIG. 1B is a cross sectional side view illustration of a semiconductor package comprising multiple dies encapsulated in multiple molding compounds, according to another embodiment.
Figure 1C:
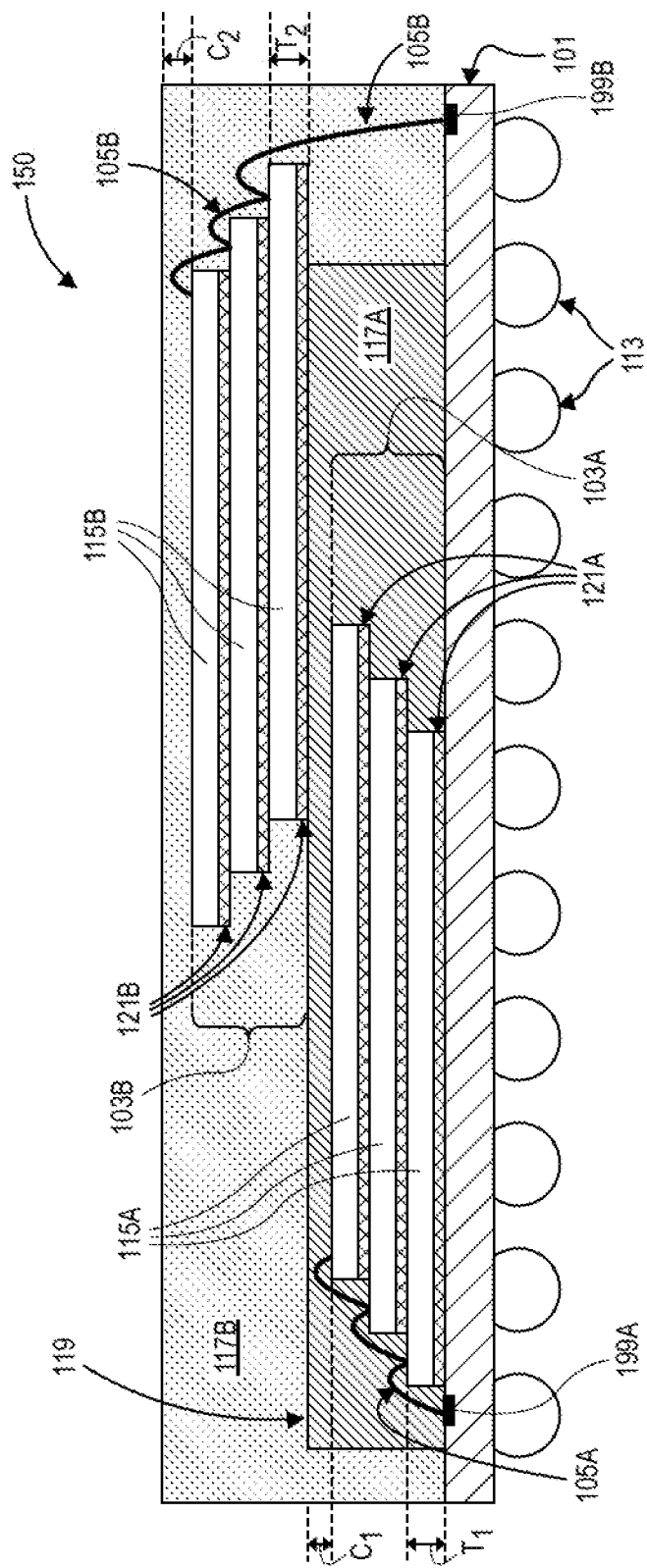
FIG. 1C is a cross sectional side view illustration of a semiconductor package comprising multiple die stacks encapsulated in multiple molding compounds, according to one embodiment.
Figure 1D:
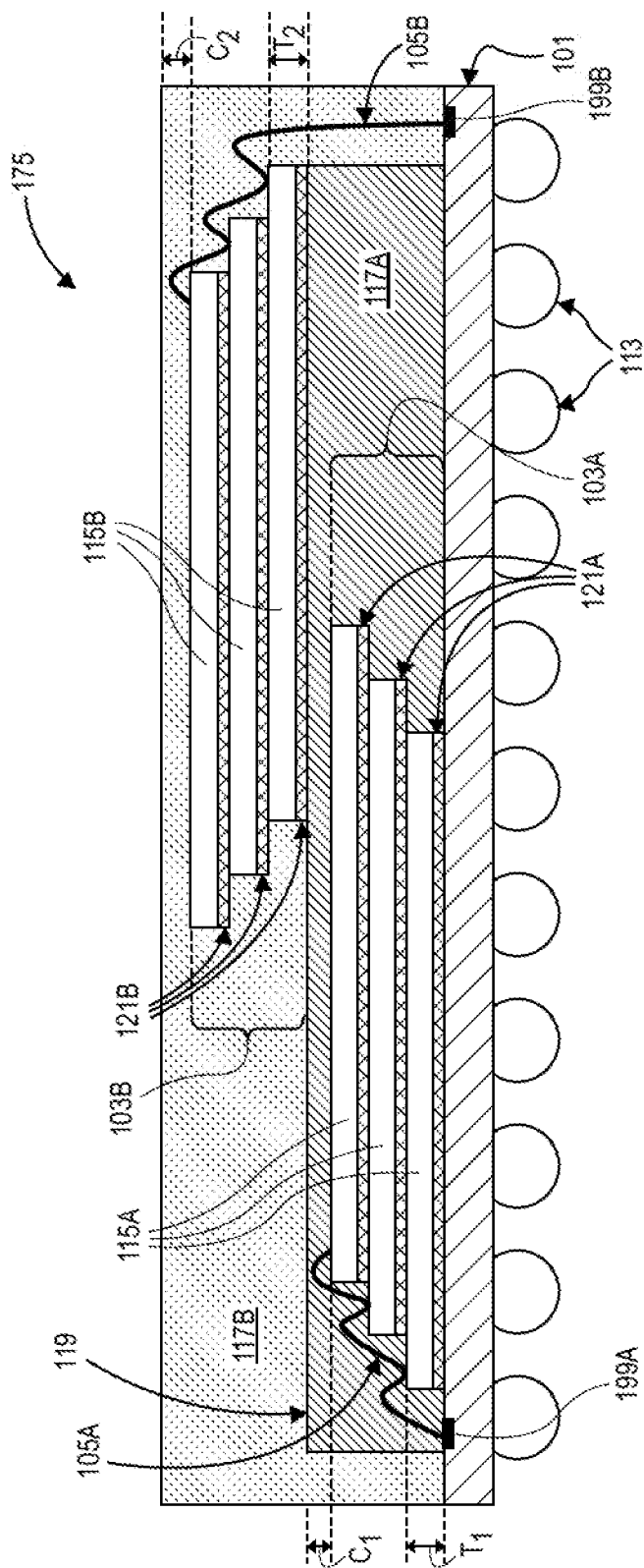
FIG. 1D is a cross sectional side view illustration of a semiconductor package comprising multiple die stacks encapsulated in multiple molding compounds, according to yet another embodiment.

With regard now to FIGS. 1B-1D, a plurality of semiconductor packages 125, 150, and 175 are shown. Each of the semiconductor packages 125, 150, and 175 in FIGS. 1B-1D, respectively, includes many components that are the same as or similar to components described above in connection with the semiconductor package 100 in FIG. 1A. For brevity, these components are not described again unless the description is necessary for understanding the semiconductor packages 125, 150, and 175 in FIGS. 1B-1D. Furthermore, each of FIGS. 1B-1D includes the same advantages as those described above in connection with FIG. 1A. For brevity, these advantages are not described again unless such description is necessary for understanding FIGS. 1B-1D.

FIG. 1B is a cross sectional side view illustration of a semiconductor package 125 comprising dies 115A-115B encapsulated in molding compounds 117A-117B, according to another embodiment. The semiconductor package 125 is similar to the semiconductor package 100, with the exception that the die 115B does not overhang the molding compound 117A. That is, the die 115B is entirely on the molding compound 117A. As shown, the die 115B is firmly supported by the molding compound 117A and rigidly held in place by the molding compound 117B.

FIG. 1C is a cross sectional side view illustration of a semiconductor package 150 comprising die stacks 103A-103B encapsulated in molding compounds 117A-117B, according to one embodiment. The semiconductor package 150 is similar to the semiconductor package 100, with the exception that the semiconductor package 150 comprises die stacks 103A-103B encapsulated in the molding compounds 117A-117B, respectively. As shown, each of the die stacks 103A-103B comprises a plurality of dies 115A and 115B, respectively, that are stacked in an offset configuration. For example, the plurality of dies 115A that make up the die stack 103A are stacked on top one another in an offset manner that results in upper dies 115A overhanging lower dies 115A. In one embodiment, at least two dies selected from the die stack 103A, the die stack 103B, or both have a same or similar z-height. Furthermore, and in one embodiment, the base die of each die stack 103A-103B has a thickness that is less than or equal to a thickness of at least one of the dies 115A-115B on the base die. Stated differently, the base die of each of the die stacks 103A-103B is not thicker than the dies on the base die. Given that the thicknesses of the dies 115A-115B in the die stacks 103A-103B do not exceed each other, the z-height of the semiconductor package 150 may be optimized (e.g., reduced, etc.). As shown in FIG. 1C, the die stack 103B overhangs the molding compound 117A. In one embodiment, the die stack 103B is firmly supported by the molding compound 117A and rigidly held in place by the molding compound 117B.

FIG. 1D is a cross sectional side view illustration of a semiconductor package 175 comprising die stacks 103A-103B encapsulated in molding compounds 117A-117B, according to another embodiment. The semiconductor package 175 is similar to the semiconductor package 150, with the exception that the semiconductor package 175 comprises a die stack 103B that does not overhang the molding compound 117A. Similar to the description provided above in connection with FIG. 1B, the die stack 103B is firmly supported by the molding compound 117A and rigidly held in place by the molding compound 117B.

Figure 2C:
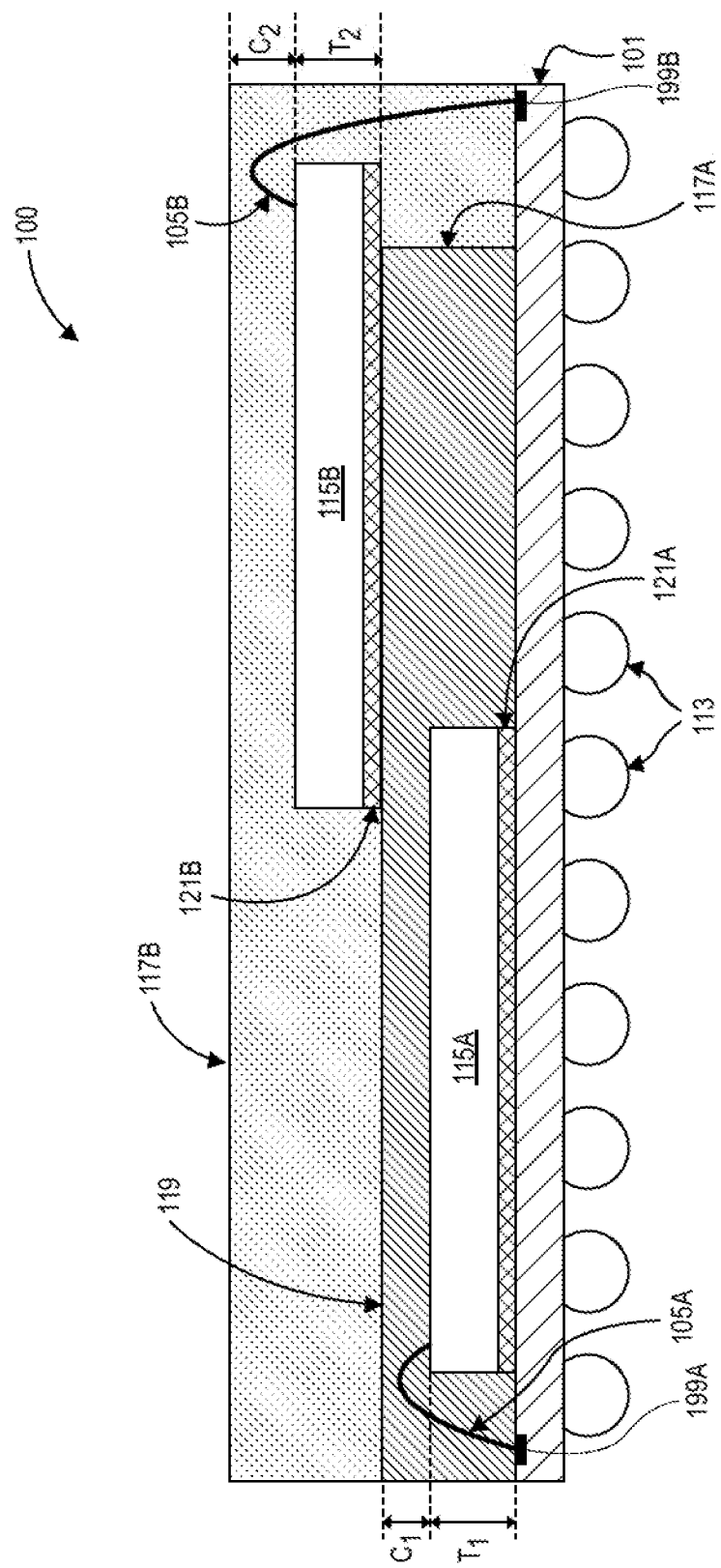

FIGS. 2A-2C are cross sectional side view illustrations of a process of fabricating the semiconductor package 100 comprising multiple dies 115A-115B encapsulated in multiple molding compounds 117A-117B, according to one embodiment. With regard now to FIG. 2A, a die 115A, a substrate 101, pads 199A-199B, a die attach material 121A, and a wire bond 105A are shown. The process, as shown in FIG. 2A, includes physically coupling the die 115A to the substrate 101 using the die attach material 121A. The process, as shown in FIG. 2A, also includes electrically coupling the die 115A to the pad 199A in the substrate 101 using the wire bond 105A.

Next, in FIG. 2B, the process includes encapsulating top and sidewall surfaces of the die 115A, sidewall surfaces of the die attach material 121A, and the entire wire bond 105A in the molding compound 117A. A thickness of the molding compound 117A may be reduced (e.g., via polishing, via grinding, etc.) to achieve a desired thickness. For example, the molding compound 117A may be polished or grinded until a desired clearance distance $C_1$, which is measured from a top surface of the die 115A to a top surface of the molding compound 117A, is achieved. In one embodiment, the desired clearance distance $C_1$ ranges from 20 µm to 80 µm.

In addition, and as shown in FIG. 2B, the process includes positioning or disposing a die 115B on the molding compound 117A such that the die 115B overhangs the molding compound 117A. The process, as shown in FIG. 2B, includes physically coupling the die 115B to the substrate 101 using a die attach material 121B. Also, the process, as shown in FIG. 2B, includes electrically coupling the die 115B to the pad 199B in the substrate 101 using a wire bond 105B. In one embodiment, a thickness $T_1$ of the first die 115A is less than or equal to a thickness $T_2$ of the second die 115B.

Referring now to FIG. 2C, the process includes encapsulating top and sidewall surfaces of the molding compound 117A, top and sidewall surfaces of the die 115B, sidewall surfaces of the die attach material 121B, and the entire wire bond 105B in a molding compound 117B. A thickness of the molding compound 117B may be reduced (e.g., via polishing, via grinding, etc.) to achieve a desired thickness. For example, the molding compound 117B may be polished or grinded until a desired clearance distance $C_2$, which is measured from a top surface of the die 115B to a top surface of the molding compound 117B, is achieved. In one embodiment, the desired clearance distance $C_2$ is at least 20 µm. Furthermore, and as shown in FIG. 2C, the process includes forming a plurality of interconnects (e.g., bumps, pillars, etc.) 113 on a bottom surface of the substrate 101.

Figure 3A:
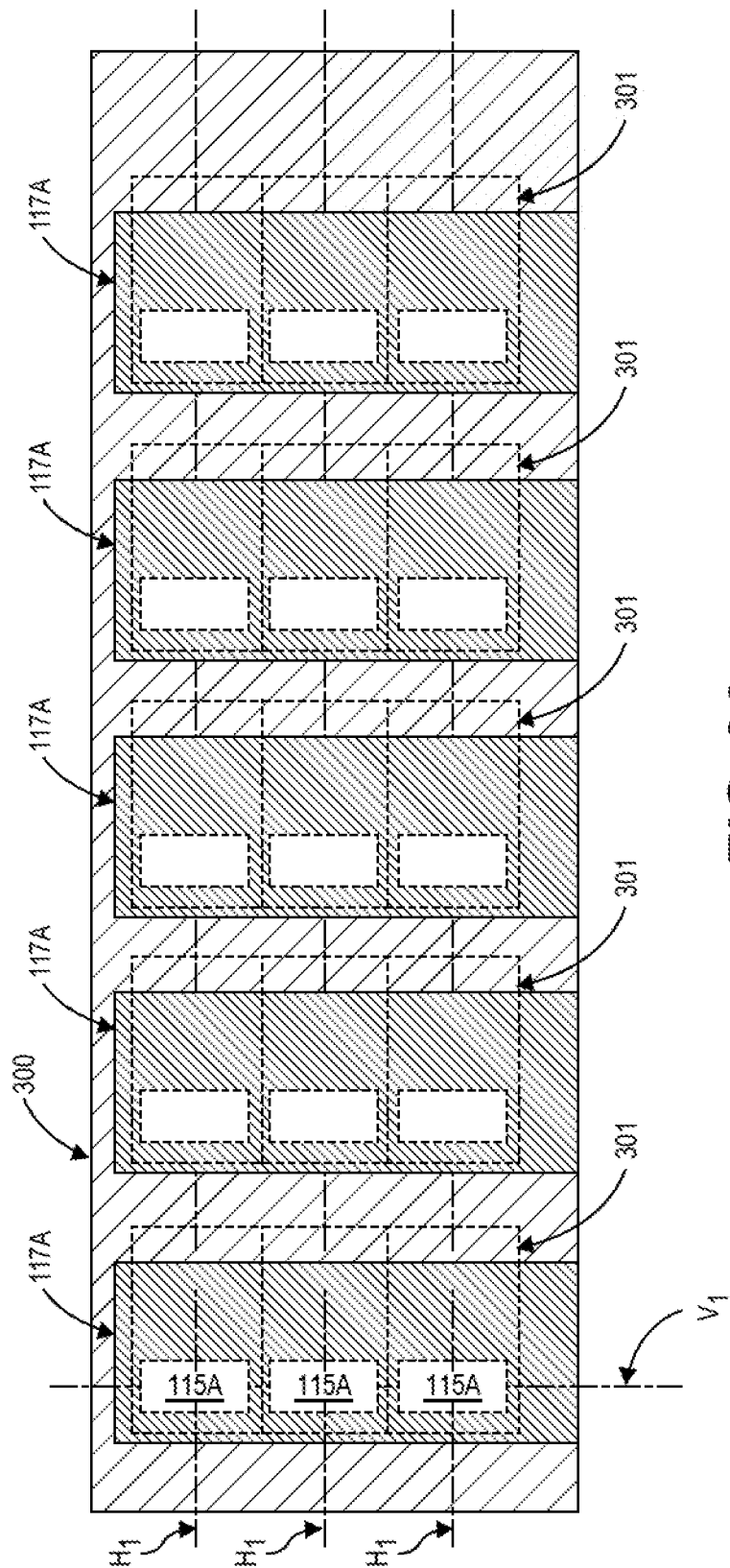
FIGS. 3A-3C are plan view illustrations of a process of encapsulating multiple dies or die stacks in multiple molding compounds on a panel substrate, according to one embodiment.
Figure 3B:
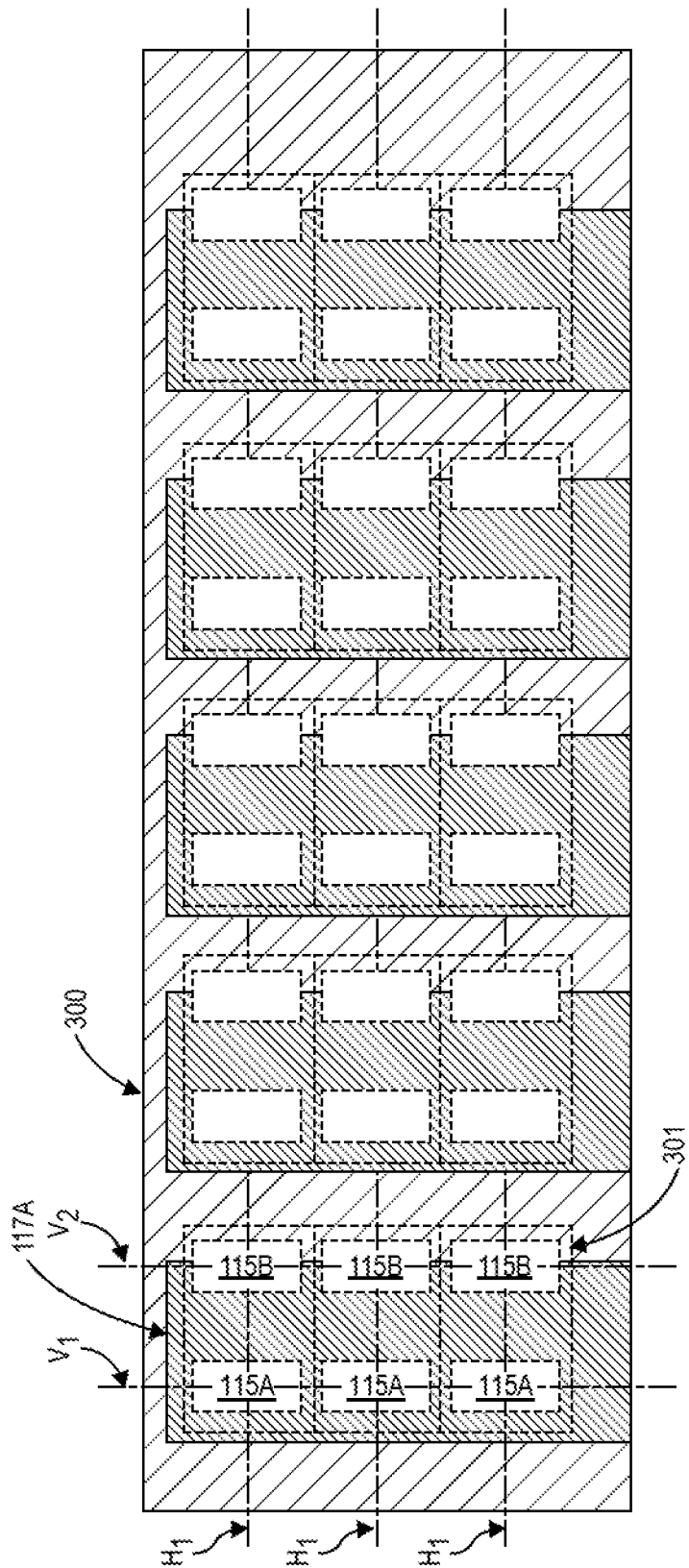
Figure 3C:
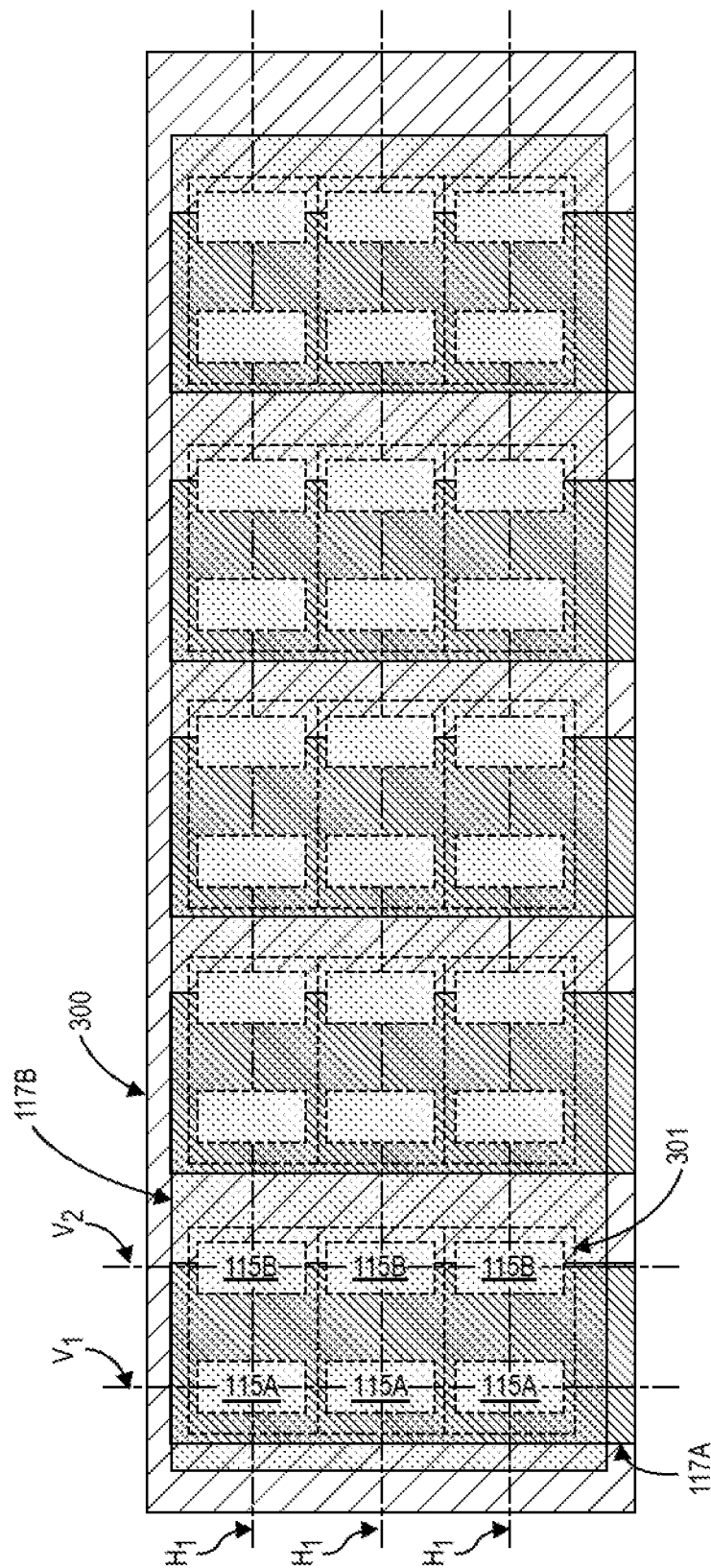

FIGS. 3A-3C are plan view illustrations of a process of encapsulating multiple dies or die stacks 115A-115B in multiple molding compounds 117A-117B on a panel substrate 300, according to one embodiment. With regard now to FIG. 3A, a panel substrate 300, a plurality of dies 115A, and a molding compound 117A are shown. The process, as shown in FIG. 3A, includes disposing or positioning a plurality of dies 115A on a panel substrate 300. In one embodiment, and as shown in FIG. 3A, the dies 115A are separated into groups 301 on the panel substrate 300. Next, the process, as shown in FIG. 3A, includes encapsulating the plurality of dies 115A in a molding compound 117A. More specifically, the process includes encapsulating the dies 115A in a group 301 in a molding compound 117A, where the molding compound 117A is a strip of molding material.

As shown in FIG. 3A, the dies 115A in each group 301 are arranged along an axis $V_1$. Furthermore, and as shown in FIG. 3A, the dies 115A across the groups 301 are arranged along an axis $H_1$.

Moving on to FIG. 3B, a plurality of dies 115B is disposed or positioned on the molding compound 117A such that each of the dies 115B overhangs the molding compound 117A. In one embodiment, and as shown in FIG. 3B, the dies 115B are included in the groups 301. Each die 115B in a group 301 is disposed on the strip of molding compound 117A in the group 301 such that each die 115B in the group 301 overhangs the strip of molding compound 117A. As shown in FIG. 3B, the dies 115B in each group 301 are arranged along an axis $V_2$. Furthermore, and as shown in FIG. 3B, the dies 115B across the groups 301 are arranged along the axis $H_1$.

Referring now to FIG. 3C, the process includes encapsulating all of the groups 301 in a molding compound 117B. In one embodiment, the molding compound 117B is a single structure (e.g., a strip of molding material, a sheet of molding material, etc.) that encapsulates all of the plurality of molding compounds 117A and the plurality of dies 115A-115B. Following encapsulation by the molding compound 117B, additional processing operations may be performed on the processed panel substrate 300 until a plurality of semiconductor packages are formed. Examples of these additional processing operations include, but are not limited to, forming interconnects and singulation.

Figure 4:
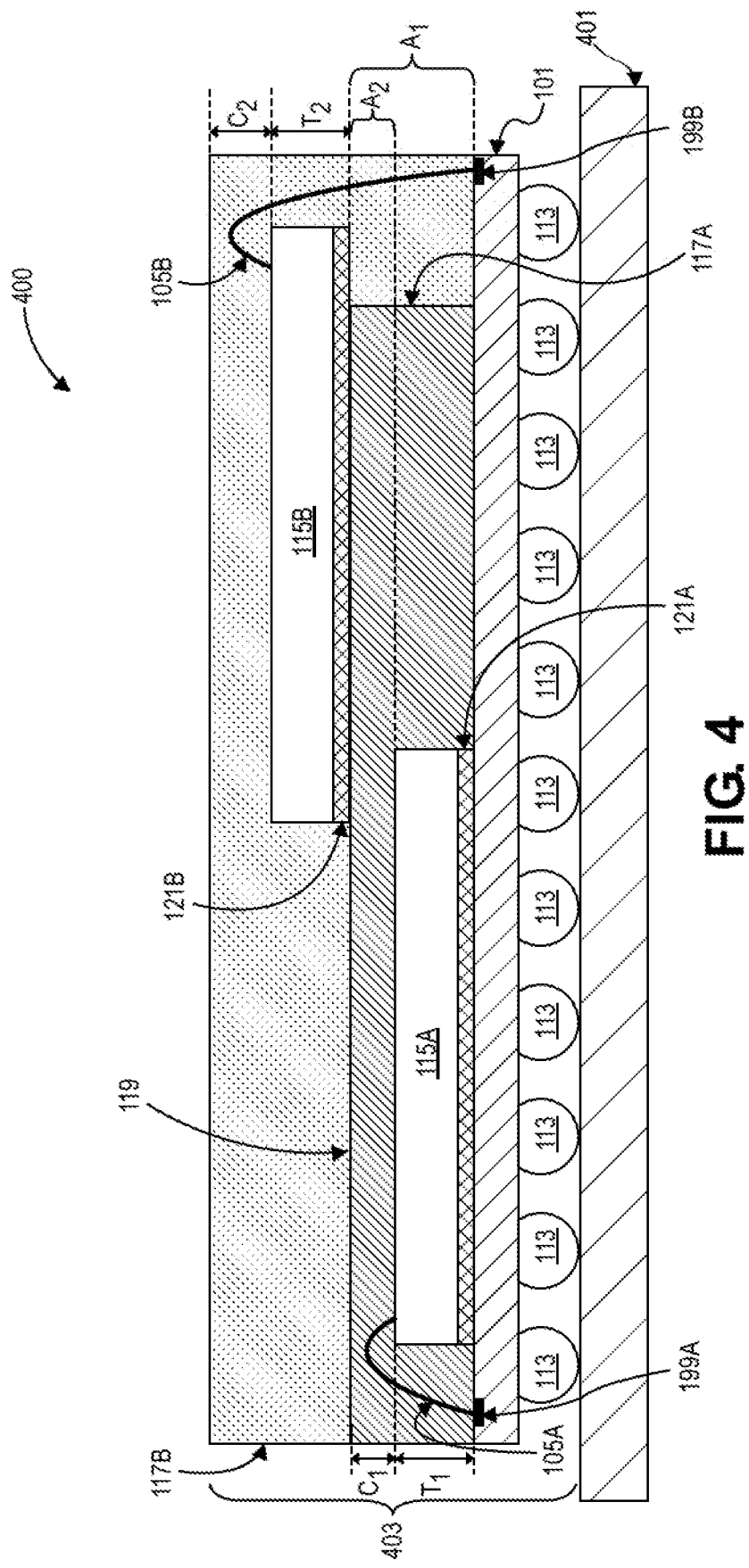
FIG. 4 is a cross sectional side view illustration of a packaged system, according to one embodiment.

FIG. 4 is a cross sectional side view illustration of a packaged system 400, according to one embodiment. In an embodiment, the packaged system 400 may include a semiconductor package 403, which is similar to or the same as any one of the semiconductor packages described above in connection with any one of FIGS. 1A-3C. It is to be appreciated that the packaged system 400 may comprise one or more semiconductor packages that are similar to or the same any one of the semiconductor packages described above in connection with any one of FIGS. 1A-3C. In an embodiment, the packaged system 400 may include the semiconductor package 403 electrically coupled to a board (e.g., a PCB, a motherboard, etc.) 401 with interconnects (e.g., bumps, pillars, etc.) 113 or any other suitable interconnect architecture, such as wire bonding, ball grid array, pin grid array, land grid array, or the like.

FIG. 5 is a schematic illustration of a computer system, according to one embodiment. FIG. 5 illustrates a schematic of computer system 500 according to an embodiment. The computer system 500 (also referred to as an electronic system 500) can include a semiconductor package comprising multiple dies or die stacks encapsulated in multiple molding compounds in accord with any of the embodiments and their equivalents as set forth in this disclosure. The computer system 500 may be a mobile device, a netbook computer, a wireless smart phone, a desktop computer, a hand-held reader, a server system, a supercomputer, or a high-performance computing system.

The system 500 can be a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In one embodiment, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512. As used herein, the processor 512 may mean any type of circuit such as, but not limited to, a microprocessor, a microcontroller, a graphics processor, a digital signal processor, or another processor. In an embodiment, the processor 512 includes, or is coupled with, a semiconductor package comprising multiple dies or die stacks encapsulated in multiple molding compounds in accordance with any of the embodiments and their equivalents, as described in the foregoing specification. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM). In one embodiment, the on-die memory 516 may be packaged with a process in accordance with any of the embodiments and their equivalents, as described in the foregoing specification.

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In an embodiment, the electronic system 500 also includes a display device 550 and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera, a digital sound recorder, or both.

At least one of the integrated circuits 510 or 511 can be implemented in a number of different embodiments, including a semiconductor package comprising multiple dies or die stacks encapsulated in multiple molding compounds as described herein, an electronic system, a computer system, one or more methods of fabricating an integrated circuit, and one or more methods of fabricating a semiconductor package comprising multiple dies or die stacks encapsulated in multiple molding compounds, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising a stress absorption material in accordance with any of the disclosed embodiments as set forth herein and their art-recognized equivalents. A foundation substrate may be included, as represented by the dashed line of FIG. 5. Passive devices may also be included, as is also depicted in FIG. 5.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Example Embodiment 1

A semiconductor package, comprising: a substrate; a first die on the substrate; a first molding compound encapsulating the first die on the substrate; a second die on the first molding compound; and a second molding compound encapsulating the second die and at least one portion of the first molding compound. The first and second dies are electrically coupled to the substrate.

Example Embodiment 2

The semiconductor package of example embodiment 1, wherein the second die overhangs the first molding compound.

Example Embodiment 3

The semiconductor package of example embodiment 1, wherein the second die is entirely on the first molding compound.

Example Embodiment 4

The semiconductor package of any one of example embodiments 1-3, wherein a weld line demarcates the first molding compound from the second molding compound.

Example Embodiment 5

The semiconductor package of any one of example embodiments 1-4, wherein a material composition of the first molding compound is different than a material composition of the second molding compound.

Example Embodiment 6

The semiconductor package of any one of example embodiments 1-5, wherein the first molding compound comprises first and second surfaces that are opposite each other and sidewall surfaces coupling the first and second surfaces of the first molding compound to each other, wherein the first surface of the first molding compound is above the first die, wherein the second surface of the first molding compound is on the substrate, and wherein the second molding compound contacts a portion of the first surface.

Example Embodiment 7

The semiconductor package of example embodiment 6, wherein the second molding compound further covers the sidewall surfaces of the first molding compound.

Example Embodiment 8

The semiconductor package of any one of example embodiments 1-7, wherein a footprint of the second die at least partially overlaps a footprint of the first die.

Example Embodiment 9

The semiconductor package of any one of example embodiments 1-8, wherein the first die is electrically coupled to the substrate using a first wire bond and the second die is electrically coupled to the substrate using a second wire bond.

Example Embodiment 10

The semiconductor package of example embodiment 9, wherein the first wire bond and the second wire bond are attached to pads on opposite ends of the substrate.

Example Embodiment 11

The semiconductor package of any one of example embodiments 9-10, wherein the first wire bond is entirely within the first molding compound and the second wire bond is entirely within the second molding compound.

Example Embodiment 12

The semiconductor package of any one of example embodiments 1-11, wherein an area between the second die and the package substrate comprises the first molding compound, the second molding compound, or both.

Example Embodiment 13

The semiconductor package of any one of example embodiments 1-12, wherein the first die is part of a first plurality of dies that is electrically coupled to the substrate, wherein the second die is part of a second plurality of dies that is electrically coupled to the substrate, wherein the first molding compound encapsulates the first plurality of dies on the substrate, and wherein the second molding compound encapsulates the second plurality of dies and the at least one portion of the first molding compound.

Example Embodiment 14

The semiconductor package of claim 13, wherein, for one or both of the first and second plurality of dies, a thickness of a first die in contact with the substrate is less than or equal to a thickness of a second die above or on the first die.

Example Embodiment 15

The semiconductor package of any one of example embodiments 1-13, wherein a thickness of the first molding compound above the first die is equal to or greater than 20 microns (μm).

Example Embodiment 16

A method, comprising: disposing a first plurality of dies on a panel substrate, each of the first plurality of dies aligned with other dies of the first plurality of dies; encapsulating the first plurality of dies on the panel substrate in a first molding compound; disposing a second plurality of dies on the first molding compound, each of the second plurality of dies aligned with other dies of the second plurality of dies; and encapsulating the second plurality of dies and the first molding compound in a second molding compound.

Example Embodiment 17

The method of example embodiment 16, wherein the first molding compound is a strip of molding material that encapsulates the first plurality of dies.

Example Embodiment 18

The method of any one of example embodiments 16-17, wherein the second molding compound is a strip of molding material that encapsulates the first molding compound and the second plurality of dies.

Example Embodiment 19

The method of any one of example embodiments 16-18, further comprising: reducing a thickness of the first molding compound using one or more polishing or grinding techniques.

Example Embodiment 20

The method of any one of example embodiment 16-19, wherein the thickness of the first molding compound differs from a thickness of second molding compound.

Example Embodiment 21

A packaged system, comprising: a printed circuit board (PCB); and a semiconductor package coupled to the PCB via a plurality of interconnects. The semiconductor package comprises: a substrate; a first die on the substrate; a first molding compound encapsulating the first die on the substrate; a second die on the first molding compound; and a second molding compound encapsulating the second die and at least one portion of the first molding compound. The first and second dies are electrically coupled to the substrate.

Example Embodiment 22

The packaged system of example embodiment 20, wherein the second die overhangs the first molding compound.

Example Embodiment 23

The packaged system of example embodiment 20, wherein the second die is entirely on the first molding compound.

Example Embodiment 24

The packaged system of any one of example embodiments 20-23, wherein a material composition of the first molding compound is different than a material composition of the second molding compound.

Example Embodiment 25

The packaged system of any one of example embodiments 20-24, wherein an area between the second die and the package substrate comprises the first molding compound, the second molding compound, or both.

Example Embodiment 26

The packaged system of any one of example embodiments 20-25, wherein the first die is part of a first plurality of dies that is electrically coupled to the substrate, wherein the second die is part of a second plurality of dies that is electrically coupled to the substrate, wherein the first molding compound encapsulates the first plurality of dies on the substrate, and wherein the second molding compound encapsulates the second plurality of dies and the at least one portion of the first molding compound. For one or both of the first and second plurality of dies, a thickness of a first die in contact with the substrate is less than or equal to a thickness of a second die above or on the first die.

The invention claimed is:
1. A semiconductor package, comprising:
a substrate, the substrate having a first outermost sidewall laterally opposite a second outermost sidewall;
a first die on the substrate, the first die electrically coupled to the substrate, and the first die having a first sidewall laterally opposite a second sidewall;
a first molding compound encapsulating the first die on the substrate, the first molding compound in contact with the first sidewall and the second sidewall of the first die, and the first molding compound having a first outermost sidewall and a second outermost sidewall, the second outermost sidewall laterally opposite the first outermost sidewall, and the first outermost sidewall of the first molding compound in vertical alignment with the first outermost sidewall of the substrate;
a second die on the first molding compound, the second die having a portion electrically coupled to the substrate, the portion of the second die extending laterally beyond the second outermost sidewall of the first molding compound; and
a second molding compound encapsulating the second die and at least one portion of the first molding compound.

2. The semiconductor package of claim 1, wherein a weld line demarcates the first molding compound from the second molding compound.

3. The semiconductor package of claim 1, wherein a material composition of the first molding compound is different than a material composition of the second molding compound.

4. The semiconductor package of claim 1, wherein:
the first molding compound comprises first and second surfaces that are opposite each other and the first and second outermost sidewall surfaces coupling the first and second surfaces of the first molding compound to each other,
the first surface of the first molding compound is above the first die,
the second surface of the first molding compound is on the substrate, and
the second molding compound contacts a portion of the first surface.

5. The semiconductor package of claim 4, wherein the second molding compound further covers the first and second outermost sidewall surfaces of the first molding compound.

6. The semiconductor package of claim 1, wherein a footprint of the second die at least partially overlaps a footprint of the first die.

7. The semiconductor package of claim 1, wherein the first die is electrically coupled to the substrate using a first wire bond and the second die is electrically coupled to the substrate using a second wire bond.

8. The semiconductor package of claim 7, wherein the first wire bond and the second wire bond are attached to pads on opposite ends of the substrate.

9. The semiconductor package of claim 7, wherein the first wire bond is entirely within the first molding compound and the second wire bond is entirely within the second molding compound.

10. The semiconductor package of claim 1, wherein an area between the second die and the package substrate comprises the first molding compound, the second molding compound, or both.

11. The semiconductor package of claim 1, wherein:
the first die is part of a first plurality of dies that is electrically coupled to the substrate,
the second die is part of a second plurality of dies that is electrically coupled to the substrate,
the first molding compound encapsulates the first plurality of dies on the substrate, and
the second molding compound encapsulates the second plurality of dies and the at least one portion of the first molding compound.

12. The semiconductor package of claim 11, wherein, for one or both of the first and second plurality of dies, a thickness of a first die in contact with the substrate is less than or equal to a thickness of a second die above or on the first die.

13. The semiconductor package of claim 1, wherein a thickness of the first molding compound above the first die is equal to or greater than 20 microns (μm).

14. A method, comprising:
disposing a first plurality of dies on a panel substrate, each of the first plurality of dies aligned with other dies of the first plurality of dies, and each of the plurality of first dies having a first sidewall laterally opposite a second sidewall, the substrate having a first outermost sidewall laterally opposite a second outermost sidewall;
encapsulating the first plurality of dies on the panel substrate in a first molding compound, the first molding compound in contact with the first sidewall and the second sidewall of each of the plurality of first dies, and the first molding compound having a first outermost sidewall and a second outermost sidewall, the second outermost sidewall laterally opposite the first outermost sidewall, and the first outermost sidewall of the first molding compound in vertical alignment with the first outermost sidewall of the substrate;
disposing a second plurality of dies on the first molding compound, each of the second plurality of dies aligned with other dies of the second plurality of dies, wherein a bottommost one of the second plurality of dies has a portion that extends laterally beyond the second outermost sidewall of the first molding compound, wherein the portion of the bottommost one of the second plurality of dies is electrically coupled to the panel substrate; and
encapsulating the second plurality of dies and the first molding compound in a second molding compound.

15. The method of claim 14, wherein the first molding compound is a strip of molding material that encapsulates the first plurality of dies.

16. The method of claim 14, wherein the second molding compound is a strip of molding material that encapsulates the first molding compound and the second plurality of dies.

17. The method of claim 14, further comprising:
reducing a thickness of the first molding compound using one or more polishing or grinding techniques.

18. The method of claim 17, wherein the thickness of the first molding compound differs from a thickness of second molding compound.

19. A packaged system, comprising:
a printed circuit board (PCB);
a semiconductor package coupled to the PCB via a plurality of interconnects, the semiconductor package comprising:
a substrate, the substrate having a first outermost sidewall laterally opposite a second outermost sidewall;
a first die on the substrate, the first die electrically coupled to the substrate, and the first die having a first sidewall laterally opposite a second sidewall;
a first molding compound encapsulating the first die on the substrate, the first molding compound in contact with the first sidewall and the second sidewall of the first die, and the first molding compound having a first outermost sidewall and a second outermost sidewall, the second outermost sidewall laterally opposite the first outermost sidewall, and the first outermost sidewall of the first molding compound in vertical alignment with the first outermost sidewall of the substrate;
a second die on the first molding compound, the second die having a portion electrically coupled to the substrate, the portion of the second die extending laterally beyond the second outermost sidewall of the first molding compound; and
a second molding compound encapsulating the second die and at least one portion of the first molding compound.

20. The packaged system of claim 19, wherein a material composition of the first molding compound is different than a material composition of the second molding compound.

21. The packaged system of claim 19, wherein:
the first die is part of a first plurality of dies that is electrically coupled to the substrate,
the second die is part of a second plurality of dies that is electrically coupled to the substrate,
the first molding compound encapsulates the first plurality of dies on the substrate, and
the second molding compound encapsulates the second plurality of dies and the at least one portion of the first molding compound
for one or both of the first and second plurality of dies, a thickness of a first die in contact with the substrate is less than or equal to a thickness of a second die above or on the first die.

* * * * *